United States Patent
Kitagawa et al.

(10) Patent No.: US 6,744,273 B2
(45) Date of Patent: Jun. 1, 2004

(54) SEMICONDUCTOR DEVICE CAPABLE OF REDUCING NOISE TO SIGNAL LINE

(75) Inventors: Makoto Kitagawa, Hyogo (JP); Takashi Kono, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 80 days.

(21) Appl. No.: 10/127,763

(22) Filed: Apr. 23, 2002

(65) Prior Publication Data

US 2003/0058020 A1 Mar. 27, 2003

(30) Foreign Application Priority Data

Sep. 12, 2001 (JP) ......................... 2001-276260

(51) Int. Cl.[7] ................. H03K 17/62; H03K 19/003
(52) U.S. Cl. .................. 326/15; 326/26; 326/101; 327/382; 327/403
(58) Field of Search .................. 326/15, 26, 30, 326/82, 93, 101; 327/382, 403

(56) References Cited

U.S. PATENT DOCUMENTS 5,436,573 A * 7/1995 Ogawa et al. ............... 326/17
6,184,702 B1 * 2/2001 Takahashi et al. ........... 326/21
6,285,208 B1 * 9/2001 Ohkubo ..................... 326/15

FOREIGN PATENT DOCUMENTS

JP   2000-307065   11/2000

* cited by examiner

*Primary Examiner*—Daniel D. Chang
(74) *Attorney, Agent, or Firm*—McDermott, Will & Emery

(57) ABSTRACT

A semiconductor device includes a signal line and two adjacent wirings formed on a first substrate layer, an adjacent wiring formed on a second substrate layer, and an adjacent wiring formed on a third substrate layer. A logical level on the signal line is set constant, a first line capacitance is formed between the signal line and one of the adjacent wirings on the first substrate layer, and a second line capacitance is formed between the signal line and the other of adjacent wirings on the first substrate layer. Also, a signal is supplied to the adjacent wiring on the second substrate layer and the adjacent wiring on the third substrate layer. As a result, noise from the other adjacent wirings to the signal line can be reduced.

7 Claims, 10 Drawing Sheets

F I G. 1
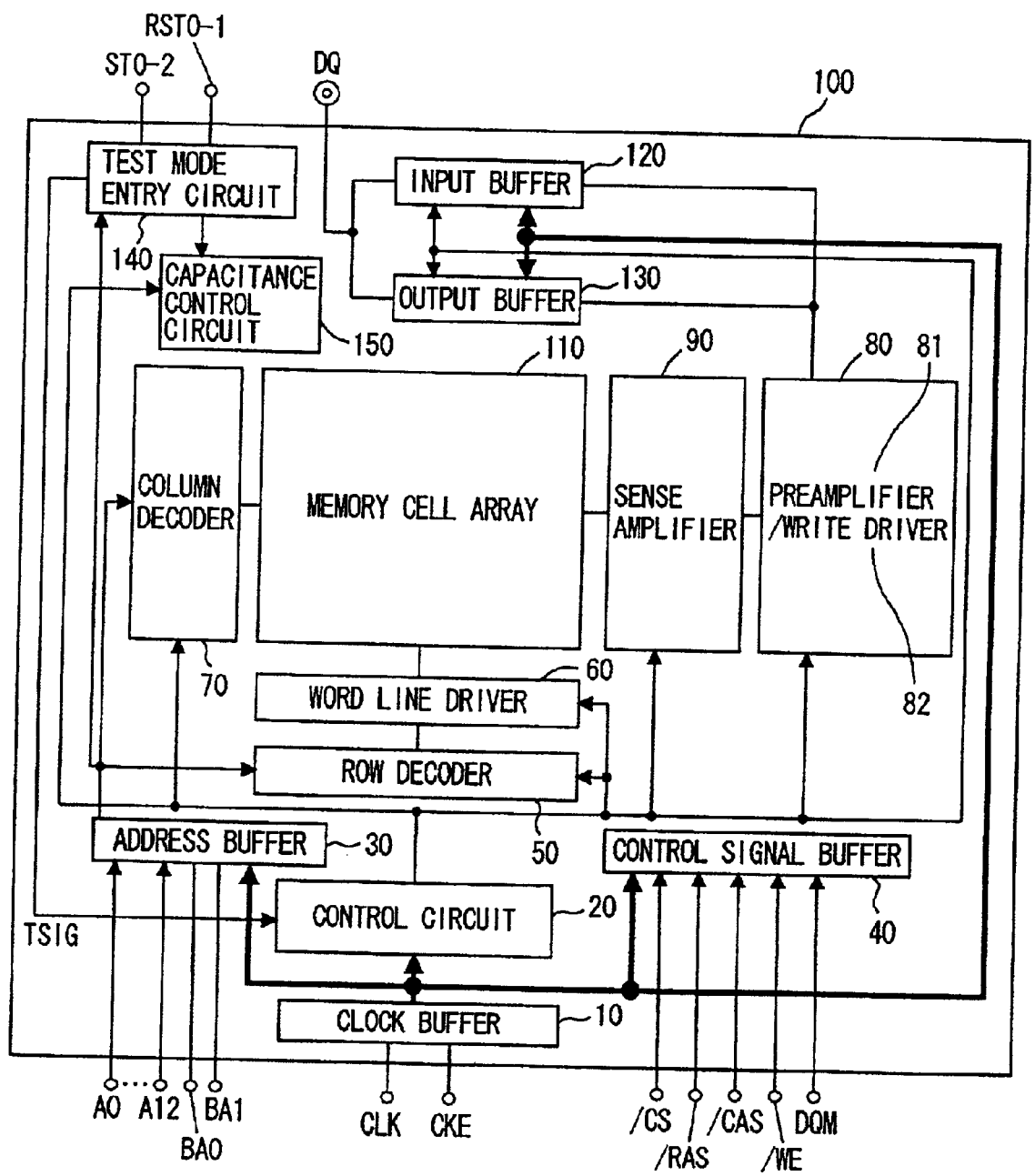

SEMICONDUCTOR DEVICE CAPABLE OF REDUCING NOISE TO SIGNAL LINE

BACKGROUND OF THE INVENTION

1. Field of the Invention

The present invention relates to a semiconductor device and particularly relates to a semiconductor device reducing noise to a signal line which can transmit a signal at high speed from an adjacent wiring.

2. Description of the Background Art

There has been known hitherto, as one of methods for reducing noise to a signal line transmitting a signal at high speed, Japnaese Patent Laying-Open No. 2000-307065 discloses a method for allowing two adjacent wirings arranged in parallel on the both sides of a signal line, respectively, to transmit a signal equal in phase and amplitude to a signal transmitted by the signal line.

That is, referring to FIG. 11, if noise to a signal line 21 from adjacent wirings 22 and 23 is to be reduced, adjacent wirings 22 and 23 are allowed to transmit a signal equal in phase and amplitude to a signal transmitted by signal line 21.

Driving means 12 to 14 drive adjacent wiring 22, signal line 21 and adjacent signal line 23 to transmit the signals, respectively.

A conventional semiconductor device includes a switch circuit 11 and switch circuit 11 selectively supplies a signal equal in phase and amplitude to the signal transmitted by signal line 21 to adjacent wirings 22 and 23 so that the selected adjacent wiring transmits the signal.

Switch circuit 11 consists of terminals 15 and 16 and a switch S1. Terminal 15 is connected to signal line 21 and terminal 16 is connected to a ground terminal 17. Switch S1 is connected to terminal 15 or 16 by a select signal SEL to apply the signal on signal line 21 or a signal having a ground voltage to driving means 12 and 14.

If a signal is transmitted by signal line 21 at high speed, switch circuit 11 is connected to terminal 15 by select signal SEL to apply a signal equal in phase and amplitude to the signal to be transmitted by signal line 21 to driving means 12 and 14. Then, driving means 12 and 14 drive adjacent wirings 22 and 23 to transmit the signal equal in phase and amplitude to the signal to be transmitted by signal line 21. As a result, noise from adjacent wirings 22 and 23 to signal line 21 is effectively eliminated.

However, since the conventional method for reducing noise from the adjacent wirings to the signal line is intended to reduce noise to the signal line between the signal line and the adjacent wirings arranged in the same plane, if another adjacent wiring exists in a perpendicular direction to the signal line, the noise to the signal line from the adjacent wiring existing in the perpendicular direction thereto cannot be disadvantageously reduced.

In other words, although the noise from the adjacent wiring to the signal line between the signal line and the adjacent wiring formed in the same plane can be reduced by allowing the signal line and the adjacent wiring to transmit signals equal in phase and amplitude, noise from another adjacent wiring existing in the perpendicular direction to the signal line cannot be reduced. In this case, as shown in FIG. 12, if an adjacent wiring existing in the perpendicular direction to the signal line is allowed to transmit a signal SGLS after a logical level on the signal line is fixed to H (logical high) level, then the signal on the signal line is turned into a signal SGLM on which noise is superimposed. If the noise is much, the logical level on the signal line disadvantageously turns into L (logical low) level.

SUMMARY OF THE INVENTION

It is, therefore, an object of the present invention to provide a semiconductor device capable of reducing noise to a signal line from a part of adjacent wirings if a plurality of adjacent wirings adjacent the signal line exist, and capable of further reducing noise from another adjacent wiring to the signal line.

It is another object of the present invention to provide a semiconductor device capable of reducing noise between a signal line and an adjacent wiring formed in the same plane, and capable of further reducing noise to the signal line from an adjacent wiring existing in a perpendicular direction to the signal line.

According to this invention, a semiconductor device includes: a signal line transmitting a signal at high speed; first and second adjacent wirings provided at positions for forming line capacitances together with the signal lines, respectively, in parallel to the signal line; and a capacitance control circuit forming between the signal line and the second adjacent wiring a second line capacitance higher than a first capacitance formed between the signal line and the first adjacent wiring.

In the semiconductor device according to this invention, the second line capacitance which is higher than the first line capacitance formed between the signal line and the first adjacent wiring, is formed between the signal line and the second adjacent wiring out of the first and second adjacent wirings adjacent the signal line. Also, the first adjacent wiring is allowed to transmit a signal. According to this invention, therefore, it is possible to reduce noise from the first adjacent wiring to the signal line.

Preferably, the capacitance control circuit supplies charges for forming the second line capacitance to the second adjacent wiring when a potential on the signal line is constant.

The charges are supplied to the second adjacent wiring and the second line capacitance higher than the first line capacitance is formed between the signal line and the second adjacent wiring. According to this invention, therefore, by controlling the quantity of charges supplied to the adjacent wirings, it is possible to control the magnitude of the second line capacitance. As a result, even if the magnitude of the first line capacitance is changed by the signal transmitted by the first adjacent wiring, it is possible to reduce noise from the first adjacent wiring to the signal line by controlling the quantity of charges supplied to the second adjacent wiring.

Preferably, the capacitance control circuit decreases charges on the second adjacent wiring in a certain ratio and thereby forms the second line capacitance when the potential on the signal line is held to be high.

While the charges are supplied to the signal line, the charges are supplied to the second adjacent wiring so as to decrease the charges in a certain ratio. In addition, the second line capacitance determined by the charges supplied to the signal line is formed between the signal line and the second adjacent wiring. According to this invention, therefore, it is possible to easily form the second line capacitance.

Preferably, the capacitance control circuit includes: a first path for directly applying charges constituting a same signal as the signal applied to the signal line, to the second adjacent wiring; a second path for applying the charges to the second adjacent wiring through a resistance; and a switch selectively connecting one of the first and second paths to the second adjacent wiring, and the switch connects the first path to the second adjacent wiring when a signal to be transmitted at high speed is applied to the signal line, and connects the second path to the second adjacent wiring when a potential on the signal line is constant.

The capacitance control circuit supplies a signal equal in phase and amplitude to the signal supplied to the signal line, to the second adjacent wiring when the signal line is allowed to transmit the signal at high speed. In addition, when charges on the signal line are held to be constant, the capacitance control circuit applies charges to the second adjacent wiring so that the charges are decreased in a certain ratio. According to this invention, therefore, it is possible to reduce noise from the adjacent wirings to the signal line in response to each mode.

Preferably, the semiconductor device further includes a test mode entry circuit generating a test mode entry signal, and the capacitance control circuit applies charges constituting an inverted signal inverted from a signal applied to the signal line, to the second adjacent wiring in response to the test mode entry signal.

When the semiconductor device is entered the test mode, the capacitance control circuit supplies a signal to the second adjacent wiring so as to spread noise from the second adjacent wiring to the signal line. According to this invention, therefore, it is possible to measure the operation margin of the signal line.

Preferably, the semiconductor device further includes a test mode entry circuit generating a test mode entry signal, and the capacitance control circuit includes: a first path for directly applying charges constituting a same signal as a signal applied to the signal line, to the second adjacent wiring; a second path for applying the charges to the second adjacent wiring through a resistance; a third path for applying charges constituting an inverted signal inverted from the signal applied to the signal line, to the second adjacent wiring; and a switch selectively connecting one of the first, second and third paths to the second adjacent wiring, and the switch connects the first path to the second adjacent wiring when a signal transmitted at high speed is applied to the signal line, connects the second path to the second adjacent wiring when a potential on the signal line is constant, and connects the third path to the second adjacent wiring when the test mode entry signal is inputted.

When the signal line is allowed to transmit a signal at high speed, the capacitance control circuit supplies a signal equal in phase and amplitude to the signal supplied to the signal line, to the second adjacent wiring. In addition, when the potential on the signal line is held to be constant, the capacitance control circuit applies charges to the second adjacent wiring so that the charges are decreased in a certain ratio. Further, when the semiconductor device is entered a test mode, the capacitance control circuit supplies a signal to the second adjacent wiring so as to spread noise from the second adjacent wiring to the signal line. According to this invention, therefore, it is possible to reduce noise from the adjacent wirings to the signal line in response to each mode and to measure the operation margin of the signal line.

Preferably, the signal line and the second adjacent wiring are formed on a same substrate layer, and the first adjacent wiring is formed on a layer arranged in a perpendicular direction to the substrate layer.

Noise to the signal line from the first adjacent wiring existing in the perpendicular direction to the signal line is reduced. According to this invention, therefore, it is possible to reduce not only noise from the adjacent wiring formed in the same plane as the signal line but also noise from the adjacent wiring existing in the perpendicular direction to the signal line.

Preferably, the semiconductor device further includes a third adjacent wiring provided at a position for forming a line capacitance together with the signal line, in parallel to the signal line, and the capacitance control circuit further forms a third line capacitance higher than the first line capacitance between the signal line and the third adjacent wiring.

A line capacitance higher than the line capacitance between the signal line and the first adjacent wiring, is formed between the signal line and the second or third adjacent wiring. According to this invention, therefore, it is possible to further reduce noise from the first adjacent wiring to the signal line.

Preferably, the semiconductor device further includes a fourth adjacent wiring provided at a position for forming a ling capacitance together with the signal line, in parallel to the signal line, and the capacitance control circuit forms the second and third line capacitances higher than a fourth line capacitance formed between the signal line and the fourth adjacent wiring and the first line capacitance, between the signal line and the second adjacent wiring and between the signal line and the third adjacent wiring, respectively.

A line capacitance higher than the line capacitance between the signal line and the first adjacent wiring or the line capacitance formed between the signal line and the fourth adjacent wiring, is formed between the signal line and the second or third adjacent wiring. According to this invention, therefore, it is possible to reduce noise from the first and fourth adjacent wirings to the signal line.

Preferably, the signal line, the second adjacent wiring and the third adjacent wiring are formed on a same substrate layer, and that the first and fourth adjacent wirings are formed on different layers arranged in a perpendicular direction to the substrate layer, respectively.

Noise to the signal line from the first and fourth adjacent wirings existing in the perpendicular direction to the signal line is reduced. According to this invention, therefore, it is possible to further reduce noise to the signal line from the adjacent wirings formed in the same plane as that of the signal line and noise to the signal line from the adjacent wirings existing in the perpendicular direction to the signal line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of a DRAM;

DESCRIPTION OF THE PREFERRED EMBODIMENTS

Figure 2:
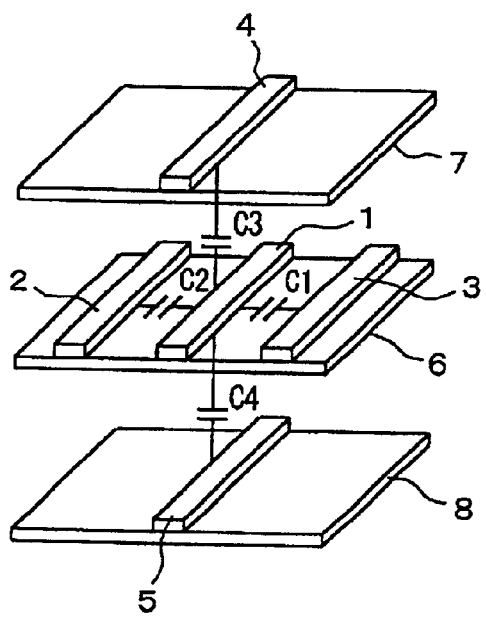
FIG. 2 is a perspective view for describing a noise prevention principle.

The embodiments of the present invention will be described hereinafter in detail with reference to the drawings. It is noted that same or corresponding constituent elements in the drawings are denoted by the same reference symbols and repetitive description will not be given thereto.

FIG. 1 shows a DRAM (Dynamic Random Access Memory) which is one example of a semiconductor device according to the present invention. A DRAM 100 includes a clock buffer 10, a control circuit 20, an address buffer 30, a control signal buffer 40, a row decoder 50, a word line driver 60, a column decoder 70, a preamplifier/write driver 80, a sense amplifier 90, a memory cell array 110, an input buffer 120, an output buffer 130, a test mode entry circuit 140 and a capacitance control circuit 150.

Clock buffer 10 receives a clock CLK and a clock enable signal CKE from external terminals, latches clock CLK and, if dock enable signal CKE is switched from L level to H level, supplies latched clock CLK to control circuit 20, address buffer 30, control signal buffer 40, input buffer 120 and output buffer 130.

Control circuit 20 receives control signals such as a chip select signal/CS and the like from control signal buffer 40 and controls row decoder 50, word line driver 60, column decoder 70, preamplifier/write driver 80, sense amplifier 90, input buffer 120, output buffer 130 and capacitance control circuit 150 synchronously with clock CLK inputted from clock buffer 10. Control circuit 20, in particular, outputs a select signal in each mode to capacitance control circuit 150.

Address buffer 30 latches addresses A0 to A12 and bank addresses BA0 and BA1 inputted from external terminals, outputs latched addresses A0 to A12 to row decoder 50, column decoder 70 and test mode entry circuit 140 synchronously with clock CLK from clock buffer 10, and outputs latched bank addresses BA0 and BA1 to row decoder 50 and column decoder 70 synchronously with clock CLK.

Control signal buffer 40 latches chip select signal /CS, a row address strobe signal /RAS, a column address strobe signal /CAS, a write enable signal /WE and a data mask signal DQM inputted from external terminals, and outputs the latched control signals such as chip select signal /CS to the respective constituent elements synchronously with clock CLK from clock buffer 10. To be specific, control signal buffer 40 outputs latched chip select signal /CS to control circuit 20, latched row address strobe signal /RAS to row decoder 50, latched column address strobe signal /CAS to column decoder 70, write enable signal /WE and data mask signal DQM to write driver 82 of preamplifier/write driver 80. For the convenience of reference to the drawing, signal lines from control signal buffer 40 to the respective constituent elements are not shown.

Row decoder 50 decodes bank addresses BA0 and BA1 inputted from address buffer 30, and outputs decoded bank addresses BA0 and BA1 to word line driver 60. Also, row decoder 50 decodes, as row addresses, addresses A0 to A12 inputted from address buffer 30 at timing at which row address strobe signal /RAS inputted from control signal buffer 40 is switched from H level to L level, and outputs the decoded row addresses to word line driver 60.

Word line driver 60 activates word lines designated by bank addresses BA0, BA1 and row addresses A0 to A12 inputted from row decoder 50.

Column decoder 70 decodes bank addresses BA0 and BA1 inputted from address buffer 30. Also, column decoder 70 decodes, as column addresses, addresses A0 to A12 inputted from address buffer 30 at timing at which column address strobe signal /CAS inputted from control signal buffer 40 is switched from H level to L level. Column decoder 70 then activates bit line pairs designated by bank addresses BA0, BA1 and column addresses A0 to A12.

Preamplifier/write driver 80 consists of preamplifier 81 and write driver 82. Preamplifier 81 amplifies read data amplified by sense amplifier 90 and outputs the amplified read data to output buffer 130. Write driver 82 writes write data inputted from input buffer 120 to the activated bit line pairs through sense amplifier 90 if write enable signal /WE from control signal buffer 40 is switched from H level to L level. In this case, write driver 82 writes the write data excluding data corresponding to a period in which data mask signal DQM is at H level if data mask signal DQM is inputted from control signal buffer 40.

Sense amplifier 90 amplifies read data read from memory cells included in memory cell array 110, and outputs the amplified read data to preamplifier 81. Also, sense amplifier 90 transfers the write-data from write driver 82 to the activated bit line pairs.

Memory cell array 110 consists of four banks designated by bank addresses BA0 and BA1. Each of the four banks includes a plurality of memory cells, a plurality of bit line pairs and a plurality of word lines arranged in a matrix. Data is inputted and outputted to and from each of the plural memory cells by the activated bit line pairs and word lines.

Input buffer 120 latches write data from input/output terminal DQ, and outputs the latched write data to write driver 82 synchronously with clock CLK from clock buffer 10. Output buffer 130 outputs the read data from preamplifier 81 synchronously with clock CLK from clock buffer 10.

Test mode entry circuit 140 generates a test mode entry signal TSIG by a method to be described later based on addresses A0 to A5 from address buffer 30 and set signals ST0 to ST2 and reset signals RST0 and RST1 inputted from external terminals, and outputs test mode entry signal TSIG thus generated to control circuit 20.

Capacitance control signal 150 supplies charges to adjacent wirings adjacent signal lines, and controls the capacitances of the signal lines and the adjacent wirings by a method selected based on the select signal from control circuit 20.

Since an operation for inputting/outputting data to/from memory cells in DRAM 100 is well-known, description will not be given herein.

Referring to FIG. 2, description will be given to a method for reducing noise from the adjacent wirings to the signal lines according to the present invention. A signal line 1 and adjacent wirings 2 and 3 are formed on a substrate layer 6. Substrate layer 7 is arranged above substrate layer 6 and an adjacent wiring 4 is formed on substrate layer 7. Further, substrate layer 8 is arranged below substrate layer 6 and adjacent wiring 5 is formed on substrate layer 8.

Signal line 1 transmits a signal at high speed. The frequency of the signal transmitted on signal line 1 is in a range of, for example, several tens of megahertz to several hundreds of megahertz. If a signal is transmitted by signal line 1 at high speed, capacitance control circuit 150 supplies a signal equal in phase and amplitude to the signal supplied to signal line 1, to adjacent wirings 2 and 3 formed in the same plane. By doing so, noise from adjacent wirings 2 and 3 to signal line 1 is effectively eliminated. If a logical level on signal line 1 is fixed to H level after the signal is transmitted to signal line 1 at high speed, capacitance control circuit 150 supplies charges to adjacent wirings 2 and 3 so as to decrease charges at a certain rate. Then, if the charges on adjacent wirings 2 and 3 are decreased and logical levels on adjacent wirings 2 and 3 becomes L level, respectively, then a line capacitance C1 is formed between signal line 1 and adjacent wiring 2 and a line capacitance C2 is formed between signal line 1 and adjacent wiring 3.

Then, even if a signal is supplied to adjacent wiring 4 formed on substrate layer 7 or adjacent wiring 5 formed on substrate wiring 8, noise from adjacent wirings 4 and 5 to signal line 1 is reduced. That is to say, the supply of a signal to adjacent wirings 4 and 5 corresponds to the supply of charges to adjacent wirings 4 and 5, so that a line capacity C3 is formed between signal line 1 and adjacent wiring 4 and a line capacitance C4 is formed between signal line 1 and adjacent wiring 5. However, since line capacitances Cl and C2 are formed between signal line 1 and adjacent wiring 2 and signal line 1 and adjacent wiring 3, respectively, the noise from adjacent wirings 4 and 5 to signal line 1 is reduced compared with a case where no line capacitances Cl and C2 are formed. Consequently, it is possible to reduce the noise to signal line 1 from adjacent wirings 4 and 5 existing in a perpendicular direction to signal line 1.

Concrete examples of signal line 1 are signal lines (thick lines shown in FIG. 1) transmitting clock CLK from clock buffer 10 in DRAM 100, an concrete example of adjacent wiring 2 is a bit line BL, a concrete example of adjacent wiring 3 is a bit line /BL, a concrete example of adjacent wiring 4 is an aluminum (Al) wiring, a concrete example of adjacent wiring 5 is a wiring transmitting a signal for opening and closing a transfer gate. While bit lines BL and /BL, the signal lines transmitting clock CLK and the like are arranged at different positions in FIG. 1, FIG. 1 shows the functional blocks of the DRAM and does not show actual wirings and the like. Accordingly, bit lines BL and /BL, the signal lines transmitting clock CLK and the like are arranged adjacently in an actual DRAM.

Figure 3:
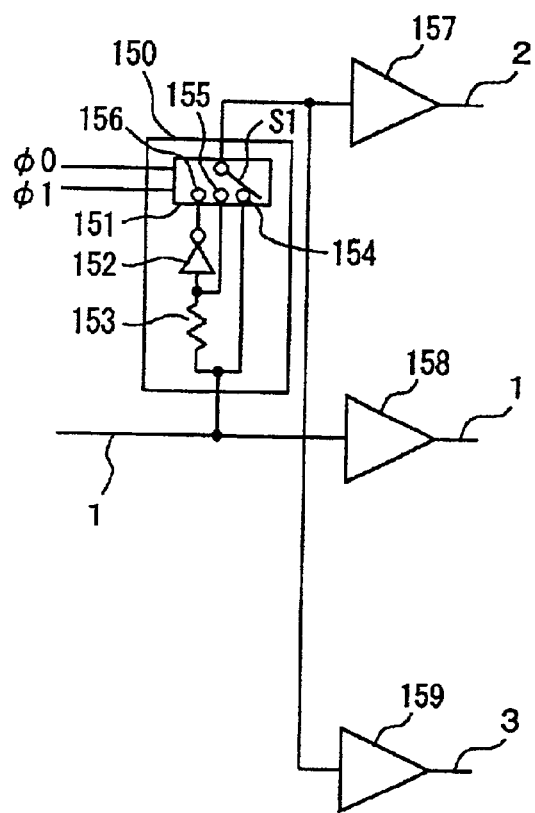
FIG. 3 is a circuit diagram of a capacitance control circuit and periphery thereof shown in FIG. 1.

Referring to FIG. 3, capacitance control circuit 150 includes a switch circuit 151, an inverter 152 and a resistance 153. Switch circuit 151 consists of a switch S1 and terminals 154 to 156. Switch S1 is connected to one of terminals 154 to 156 in accordance with a combination of the logical levels of signals $\phi 0$ and $\phi 1$. Terminal 154 is connected to signal line 1. Terminal 155 is connected to signal line 1 through resistance 153. Terminal 156 is connected to signal line 1 through inverter 152 and resistance 153.

Inverter 152 inverts the signal inputted from signal line 1 and outputs the inverted signal to terminal 156. Resistance 153 outputs the signal inputted from signal line 1 to inverter 152 and terminal 155.

Switch S1 is connected to driving means 157 and 159 and outputs the signal supplied from one of terminals 154 to 156 to driving means 157 and 159. Driving means 157 and 159 apply the signal supplied from switch S1 to adjacent wirings 2 and 3 to transmit the signal on adjacent wirings 2 and 3, respectively. Driving means 158 applies the inputted signal to signal line 1 to transmit the signal on signal line 1.

If a signal is transmitted by signal line 1 at high speed, switch S1 is connected to terminal 154 and switch 151 supplies a signal equal in phase and amplitude to the signal on signal line 1 to adjacent wirings 2 and 3. Also, if a logical level on signal line 1 is fixed to H level, switch S1 is connected to terminal 155 and switch 151 supplies the signal on signal line 1 through resistance 153 to adjacent wirings 2 and 3. If the signal on signal line 1 is supplied through resistance 153 to adjacent wirings 2 and 3, logical levels on adjacent wirings 2 and 3 are eventually switched to L level. This is because charges receive impedance due to the resistance and the capacitances and gradually decrease in this case.

Furthermore, if DRAM 100 enters a test mode, switch S1 is connected to terminal 156 and switch circuit 151 inverts and supplies the signal on signal line 1 to adjacent wirings 2 and 3. In this case, noise from adjacent wirings 2 and 3 to signal line 1 and the operation margin of signal line 1 can be tested.

As can be seen, capacitance control circuit 150 selects one of the three paths (the path of terminal 154, the path of terminal 155 and the path of terminal 156) and supplies the signal on signal line 1 to adjacent wirings 2 and 3. In addition, the supply of the signal on signal line 1 by one of the three paths to adjacent wirings 2 and 3 corresponds to the controlling of the distribution of charges on adjacent wirings 2 and 3 with respect to signal line 2, i.e., the line capacitances between signal line 1 and adjacent wirings 2 and 3, respectively.

Figure 4:
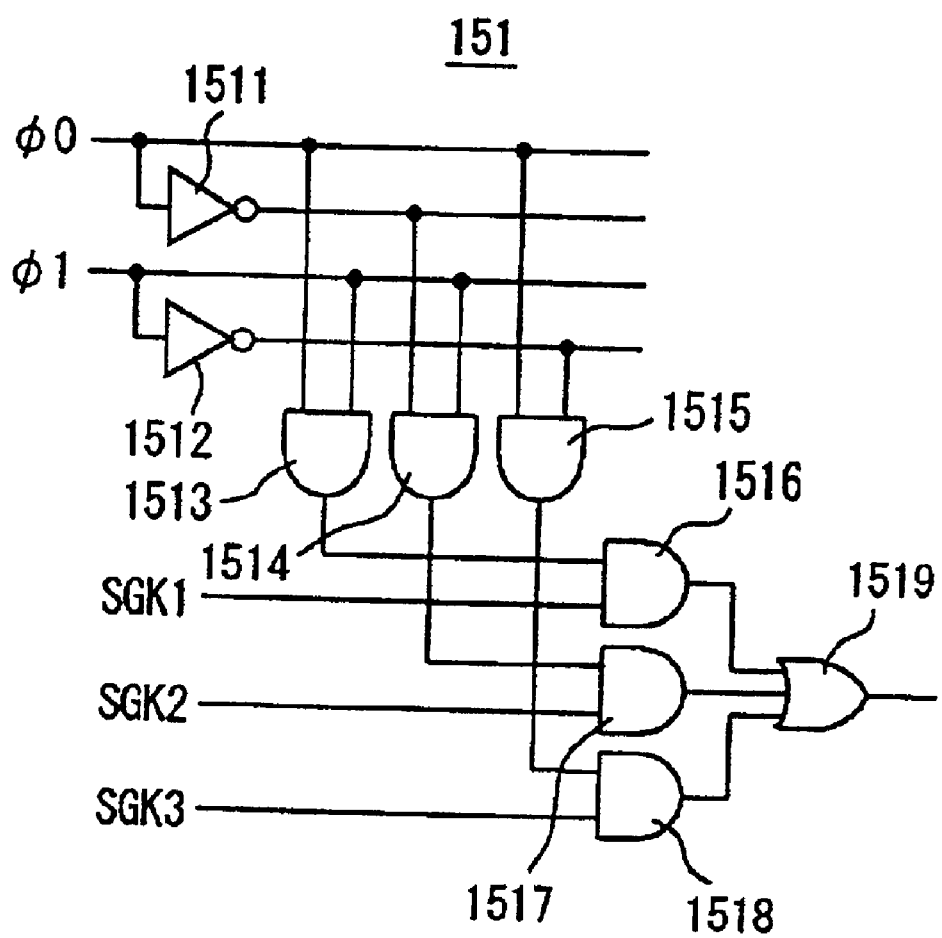
FIG. 4 is a circuit diagram of a switch circuit shown in FIG. 3.

Referring to FIG. 4, switch circuit 151 includes inverters 1511 and 1512, AND gates 1513 to 1518 and an OR gate 1519. Inverter 1511 inverts the logical level of a signal $\phi 0$ and outputs the inverted signal to AND gate 1514. Inverter 1512 inverts the logical level of a signal $\phi 1$ and outputs the inverted signal to AND gate 1515.

AND gate 1513 performs AND operation of signals $\phi 0$ and $\phi 1$ and outputs the operation result to AND gate 1516. AND gate 1514 performs AND operation of the inverted signal $/\phi 0$ of signal $\phi 0$ and signal $\phi 1$ and outputs the operation result to AND gate 1517. AND gate 1515 performs AND operation of signal $\phi 0$ and the inverted signal $/\phi 1$ of signal $\phi 1$ and outputs the operation result to AND gate 1518.

AND gate 1516 performs AND operation of the output signal of AND gate 1513 and a signal SGK1 inputted through a terminal 154 and outputs the operation result to OR gate 1519. AND gate 1517 performs AND operation of the output signal of AND gate 1514 and a signal SGK2 inputted through a terminal 155 and outputs the operation result to OR gate 1519. AND gate 1518 performs AND operation of the output signal of AND gate 1515 and a signal SGK3 inputted through a terminal 156 and outputs the operation result to OR gate 1519. Since signal SGK1 is a signal inputted through terminal 154, signal SGK1 is equal in phase and amplitude to the signal on signal line 1. Since signal SGK2 is a signal inputted through terminal 155, signal SGK2 is the signal on signal line 1 inputted through a resistance. Since signal SGK3 is a signal inputted through terminal 156, signal SGK3 is a signal inverted from the signal on signal line 1.

OR gate 1519 performs OR operation of the three output signals from AND gates 1516 to 1518 with one another and outputs the operation result to driving means 157 and 159.

Since inverters 1511 and 1512 output L-level signals when signals φ0 and φ1 are at H level, AND gate 1513 outputs a signal of H level and AND gates 1514 and 1515 output signals of L level, respectively. If so, AND gate 1516 outputs a signal according to the logical level of signal SGK1 to OR gate 1519 and AND gates 1517 and 1518 output signals of L level to OR gate 1519, irrespectively of the logical levels of signals SGK2 and SGK3, respectively. As a result, OR gate 1519 outputs the output signal of AND gate 1516, i.e., a signal according to signal SGK1.

Further, since inverter 1511 outputs a signal of H level and inverter 1512 outputs a signal of L level when signal φ0 is at L level and signal φ1 is at H level, respectively, AND gate 1513 outputs a signal of L level, AND gate 1514 outputs a signal of H level and AND gate 1515 outputs a signal of L level. If so, AND gate 1517 outputs a signal according to the logical level of signal SGK2 and AND gates 1516 and 1518 output signals of L level to OR gate 1519, irrespectively of the logical levels of signals SGK1 and SGK3, respectively. As a result, OR gate 1519 outputs the output signal of AND gate 1517, i.e., a signal according to the logical level of signal SGK2.

Further, since inverter 1511 outputs a signal of L level and inverter 1512 outputs a signal of H level when signal φ0 is at H level and signal φ1 is at L level, AND gates 1513 and 1514 output signals of L level, respectively and AND gate 1515 outputs a signal of H level. If so, AND gate 1518 outputs a signal according to the logical level of signal SGK3 to OR gate 1519 and AND gates 1516 and 1517 output signals of L level to OR gate 1519, irrespectively of the logical levels of signals SGK1 and SGK2, respectively. As a result, OR gate 1519 outputs the output signal of AND gate 1518, i.e., a signal according to the logical level of signal SGK3.

Therefore, switch circuit 151 selects one of the signals from terminals 154 to 156 according to the logical levels of signals φ0 and φ1, and applies the selected signal to driving means 157 and 159.

As can be understood from the above, by controlling the logical levels of signals φ0 and φ1, switch circuit 151 can apply the signal on signal line 1 to adjacent wirings 2 and 3 through one of the path of terminal 154, the path of terminal 155 and the path of terminal 156.

Figure 5:
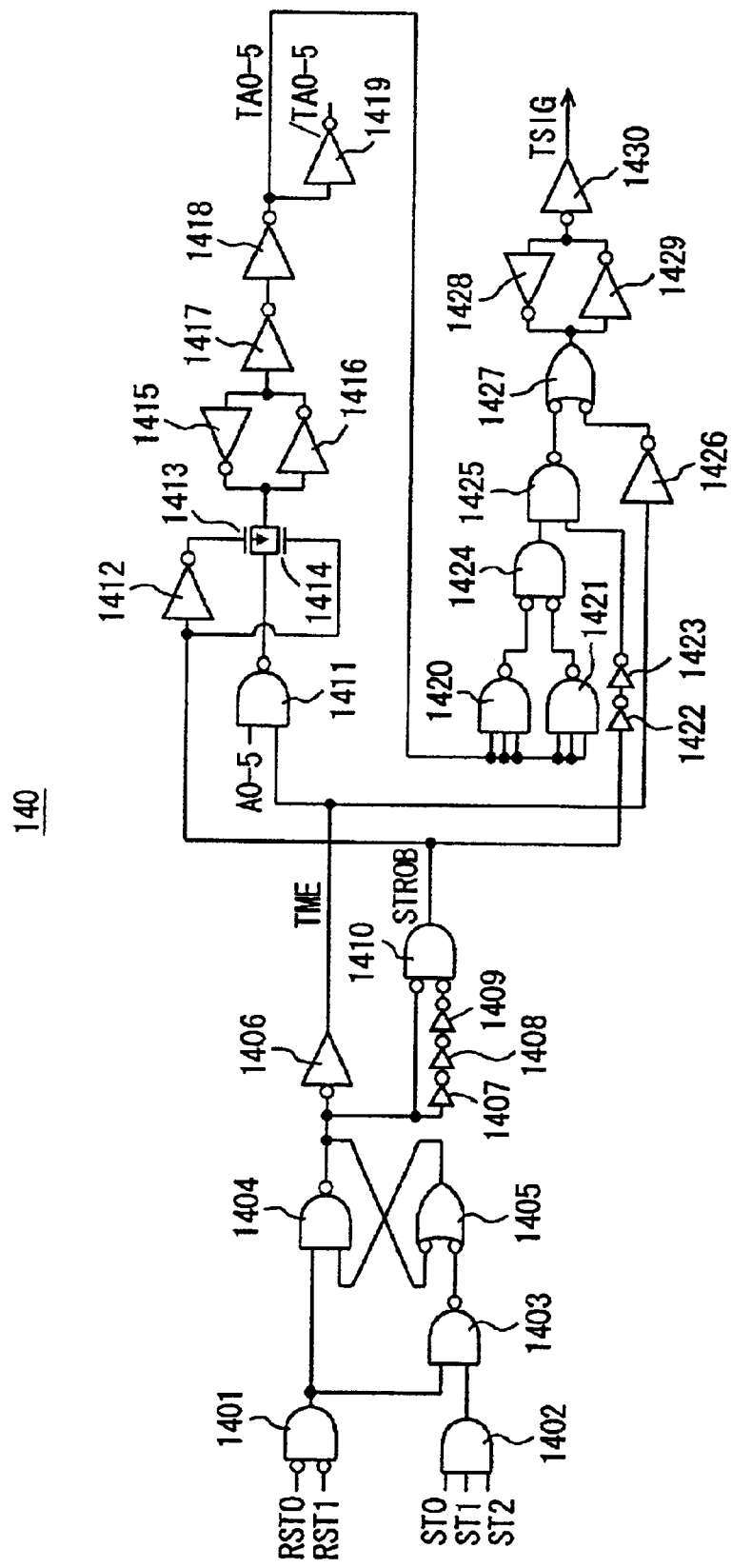
FIG. 5 is a circuit diagram of a test mode entry circuit shown in FIG. 1.

Referring to FIG. 5, test mode entry circuit 140 includes NAND gates 1401, 1403, 1404, 1410, 1411, 1420, 1421, 1424 and 1425, an AND gate 1402, NOR gates 1405 and 1427, inverters 1406 to 1409, 1412, 1415 to 1419, 1422, 1423, 1426 and 1428 to 1430, a P channel MOS transistor 1413 and an N channel MOS transistor 1414.

NAND gate 1401 performs AND operation of the inverted signals of reset signals RST0 and RST1 inputted from the external terminals and outputs the operation result to NAND gates 1403 and 1404. AND gate 1402 performs AND operation of set signals ST0 to ST2 inputted from the external terminals, and outputs the operation result to NAND gate 1403.

NAND gate 1403 performs AND operation of the output signal of NAND gate 1401 and the output signal of AND gate 1402, and outputs a signal inverted from the operation result to one of the terminals of NAND gate 1405. NAND gate 1404 performs AND operation of the output signal of NAND gate 1401 and the output signal of NOR gate 1405 and output a signal inverted from the operation result to the other terminal of NOR gate 1405 and to inverters 1406, 1407 and NAND gate 1410.

NOR gate 1405 performs OR operation of the inverted signal of the output signal of NAND gate 1403 with the inverted signal of the output signal of NAND gate 1404 and outputs the operation result to NAND gate 1404. Inverter 1406 inverts the output signal of NAND gate 1404 and outputs the inverted signal to NAND gate 1411 and inverter 1426 as a test mode signal TME.

Inverter 1407 inverts the output signal of NAND gate 1404 and outputs the inverted signal to inverter 1408, inverter 1408 inverts the output signal of inverter 1407 and outputs the inverted signal to inverter 1409, and inverter 1409 inverts the output signal of inverter 1408 and outputs the inverted signal to NAND gate 1410. Namely, inverters 1407 to 1409 invert the output signal of NAND gate 1404, delay the inverted signal by a certain period and outputs the resultant signal to NAND gate 1410. While FIG. 5 shows that three inverters are provided on the input side of NAND gate 1410, the number of inverters provided thereon is not limited to three and odd-numbered inverters may be normally provided according to the present invention.

NAND gate 1410 performs AND operation of the inverted signal of the output signal of NAND gate 1404 and the inverted signal of the output signal of inverter 1409 and outputs the operation result, as a signal STROB, to inverters 1412, 1422 and the gate terminal of N channel MOS transistor 1414.

NAND gate 1411 performs AND operation of addresses A0 to A5 inputted from address buffer 30 and test mode signal TME from inverter 1406 and outputs a signal inverted from the operation result to the source terminals of P channel MOS transistor 1413 and N channel MOS transistor 1414.

Inverter 1412 inverts signal STROB from NAND gate 1410 and outputs the inverted signal /STROB to the gate terminal of P channel MOS transistor 1413.

P channel MOS transistor 1413 and N channel MOS transistor 1414 are connected between NAND gate 1411 and inverters 1415 and 1416. The source terminal and drain terminal of P channel MOS transistor 1413 are connected to the source terminal and drain terminal of N channel MOS transistor 1414, respectively. P channel MOS transistor 1413 receives output signal /STROB of inverter 1412 at the gate terminal thereof. N channel MOS transistor 1414 receives output signal STROB of NAND gate 1410 at the gate terminal thereof. It is noted that P channel MOS transistor 1413 and N channel MOS transistor 1414 constitute a transfer gate and, when receiving signal /STROB of L level and signal STROB of H level at their respective terminals, introduce the output signal of NAND gate 1411 to inverter 1416.

Inverter 1415 inverts the output signal of inverter 1416 and outputs the inverted signal to inverter 1416, and inverter 1416 inverts the signal inputted through P channel MOS transistor 1413 and N channel MOS transistor 1414 and outputs the inverted signal to inverters 1415 and 1417.

Inverter 1417 inverts the output signal of inverter 1416 and outputs the inverted signal to inverter 1418, and inverter 1418 inverts the output signal of inverter 1417 and outputs the inverted signal, as signals TA0 to TA5, to inverter 1419 and NAND gates 1420 and 1421. In this case, inverter 1418 outputs signal TA0 to TA2 to NAND gate 1420 and signals TA3 to TA5 to NAND gate 1421.

Inverter 1419 inverts output signals TA0 to TA5 of inverter 1418 and outputs signals /TA0 to /TA5. While FIG.

5 shows that inverter 1418 outputs signals TA0 to TA5 to NAND gates 1420 and 1421, signals /TA0 to /TA5 instead of signals TA0 to TA5 may be employed in test mode entry circuit 140, in which case, inverter 1419 outputs signals /TA0 to /TA2 to NAND gate 1420 and signals /TA3 to /TA5 to NAND gate 1421.

NAND gate 1420 performs AND operation of signals TA0 to TA2 and outputs a signal inverted from the operation result to one of the terminals of NAND gate 1424. NAND gate 1421 performs AND operation of signals TA3 to TA5 and outputs a signal inverted from the operation result to the other terminal of NAND gate 1424.

Inverter 1422 inverts output signal STROB of NAND gate 1410 to inverter 1423, and inverter 1423 inverts the output signal of inverter 1422 and outputs the inverted signal to one of the terminals of NAND gate 1425. While FIG. 5 shows that output signal STROB of NAND gate 1410 is inputted into one of the terminals of NAND gate 1425 through the two inverters, the present invention is not limited thereto and output signal STROB may be normally inputted into one of the terminals of NAND gate 1425 through even-numbered inverters.

NAND gate 1424 performs AND operation of the inverted signal of the output signal of NAND gate 1420 and the inverted signal of the output signal of NAND gate 1421 and outputs the operation result to the other terminal of NAND gate 1425. NAND gate 1425 performs AND operation of the output signal of NAND gate 1424 and the output signal of inverter 1423 and outputs a signal inverted from the operation result to one of the terminals of NOR gate 1427.

Inverter 1426 inverts test mode signal TME which is the output signal of inverter 1406 and outputs the inverted signal to the other terminal of NOR gate 1427. NOR gate 1427 performs OR operation of the inverted signal of the output signal of NAND gate 1425 with the inverted signal of the output signal of inverter 1426 and outputs the operation result to inverter 1429. Inverter 1428 inverts the output signal of inverter 1429 and outputs the inverted signal to inverter 1429, and inverter 1429 inverts the output signal of NOR gate 1427 and outputs the inverted signal to inverters 1428 and 1430. Inverter 1430 inverts the output signal of inverter 1429 and outputs the inverted signal to control circuit 20 as a test mode entry signal TSIG.

It is noted that in test mode entry circuit 140, inverters 1415 and 1416, and 1428 and 1429 constitute latch circuits, respectively.

Figure 6:
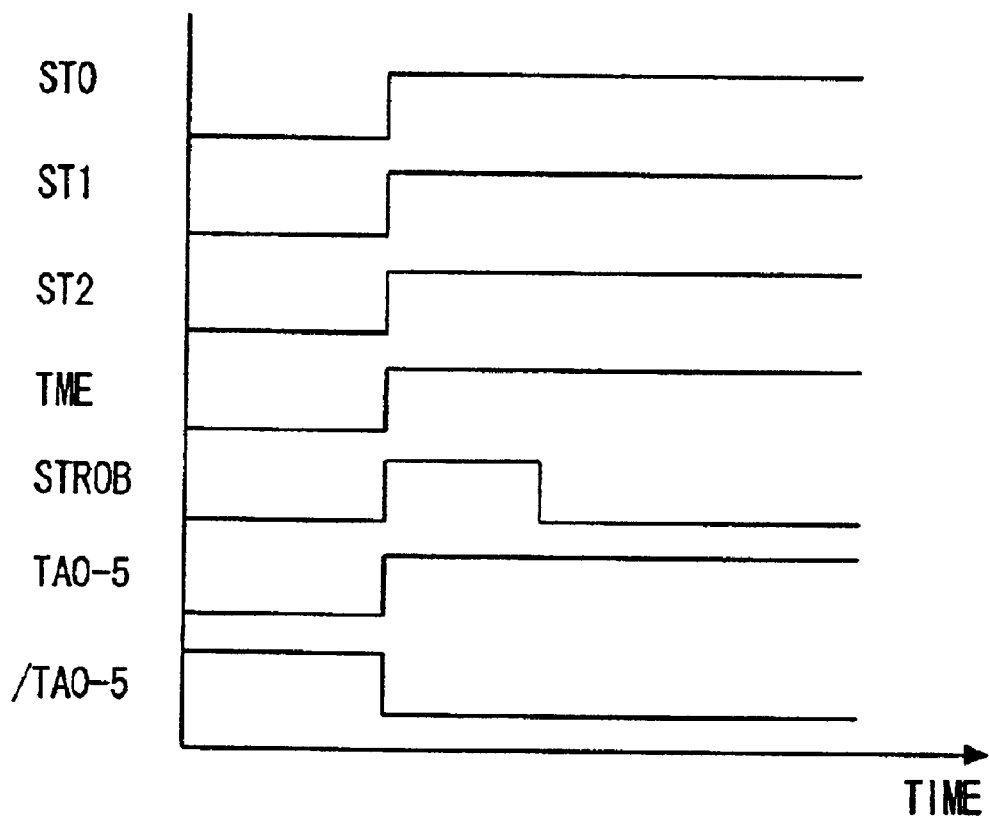
FIG. 6 is a timing chart for a signal in the test mode entry circuit.

Referring to FIG. 6, description will be given to an operation for generating test mode entry signal TSIG in test mode entry circuit 140. If test mode entry signal TSIG is to be generated, set signals ST0 to ST2 of H level, reset signals RST0 and RST1 of L level and addresses A0 to A5 of H level from the external terminals are outputted to test mode entry circuit 140.

Then, NAND gate 1401 outputs a signal of H level to NAND gates 1403 and 1404 and AND gate 1402 outputs a signal of H level to NAND gate 1403. Also, NAND gate 1403 outputs a signal of H level to NOR gate 1405 based on the signal of H level from NAND gate 1401 and the signal of H level from NAND gate 1402. NOR gate 1405 outputs a signal of H level to NAND gate 1404 based on the signal of L level from NAND gate 1403, and NAND gate 1404 outputs a signal of L level to NOR gate 1405, inverters 1406, 1407 and NAND gate 1410 based on the signal of H level from NAND gate 1401 and the signal of H level from NOR gate 1405.

Inverter 1406 receives the signal of L level and outputs test mode signal TME of H level to NAND gate 1411 and inverter 1426.

On the other hand, inverters 1407 to 1409 invert the signal of L level from NAND gate 1404 and outputs a signal delayed by a certain period to NAND gate 1410. NAND gate 1410 outputs signal STROB which turns into H level only for a certain period to inverters 1412, 1422 and the gate terminal of N channel MOS transistor 1414, based on the signal of L level from NAND gate 1404 and the signal which the signal of L level from NAND gate 1404 is inverted and thus inverted signal is delayed for a certain period. Inverter 1412 outputs signal /STROB inverted from signal STROB to the gate terminal of P channel MOS transistor 1413. Accordingly, P channel MOS transistor 1413 and N channel MOS transistor 1414 are turned on only for a period in which signal STROB is at H level.

Furthermore, NAND gate 1411 performs AND operation of addresses A0 to A5 of H level inputted from address buffer 30 and test mode signal TME of H level outputted from inverter 1406 and outputs a signal of L level inverted from the operation result to the source terminal of P channel MOS transistor 1413 and the source terminal of N channel MOS transistor 1414. As already stated above, since P channel MOS transistor 1413 and N channel MOS transistor 1414 are turned on only for the period in which signal STROB is at H level, P channel MOS transistor 1413 and N channel MOS transistor 1414 introduce the output signal of L level from NAND gate 1411 to inverter 1416 in that period. Inverter 1416 inverts the inputted signal and outputs a signal of H level to inverters 1415 and 1417, and inverter 1415 inverts the signal of H level and outputs a signal of L level to inverter 1416.

Inverter 1417 inverts the signal of H level from inverter 1416 and outputs a signal of L level to inverter 1418, and inverter 1418 inverts the signal of L level and outputs signals TA0 to TA5 of H level to inverter 1419, signals TA0 to TA2 of H level to NAND gate 1420 and signals TA3 to TA5 of H level to NAND gate 1421. Inverter 1419 outputs signals /TA0 to /TA5 of L level inverted from the signals of H level.

NAND gate 1420 performs AND operation of signals TA0 to TA2 of H level and outputs a signal of L level inverted from the operation result to NAND gate 1424, and NAND gate 1421 performs AND operation of signals TA3 to TA5 of H level and outputs a signal of L level inverted from the operation result to NAND gate 1424. NAND gate 1424 outputs a signal of H level to NAND gate 1425 based on the signals of L level from NAND gates 1420 and 1421.

On the other hand, inverters 1422 and 1423 output a signal of H level delayed from signal STROB of H level by a certain period to NAND gate 1425. NAND gate 1425 outputs a signal of L level to NOR gate 1427 based on the signal of H level from inverter 1423 and the signal of H level from NAND gate 1424. Inverter 1426 outputs a signal of L level inverted from test mode signal TME of H level to NOR gate 1427.

Then, NOR gate 1427 outputs a signal of H level to inverter 1429 based on the signal of L level from NAND gate 1425 and the signal of L level from inverter 1426, and inverter 1429 outputs a signal of L level inverted from the signal of H level to inverters 1428 and 1430. Inverter 1428 outputs a signal of H level inverted from the signal of L level to inverter 1429. Inverter 1430 inverts the signal of L level from inverter 1429 and outputs test mode entry signal TSIG of H level to control circuit 20.

Further, in test mode entry circuit 140, signals /TA0 to /TA5 instead of signals TA0 to TA5 are employed, in which case, inverter 1419 outputs signals /TA0 to /TA2 of L level to NAND gate 1420 and signals /TA3 to /TA5 of L level to NAND gate 1421.

If so, NAND gate 1420 outputs a signal of H level to NAND gate 1424 based on signals /TA0 to /TA2 of L level, and NAND gate 1421 outputs a signal of H level to NAND gate 1424 based on signals /TA3 to /TA5 of L level. NAND gate 1424 outputs a signal of L level to NAND gate 1425 based on the signals of H level from NAND gates 1420 and 1421, and NAND gate 1425 outputs a signal of H level to NOR gate 1427 based on the signal of L level from NAND gate 1424 and the signal of H level from inverter 1423.

NOR gate 1427 outputs a signal of H level to inverter 1429 based on the signal of H level from NAND gate 1425 and the signal of L level from inverter 1426. Thereafter, inverter 1430 outputs test entry mode signal TSIG of H level to control circuit 20 by the same operation as that in a case of employing signals TA0 to TA5.

As can be seen, in test mode entry circuit 140, whichever signals are employed, signals TA0 to TA5 or signals /TA0 to /TA5, when set signals ST0 to ST2 of H level, reset signals RST1 and RST2 of L level and addresses A0 to A5 of H level are inputted, test mode entry signal TSIG of H level is generated.

As a result, DRAM 100 enters a test mode, control circuit 20 outputs select signals consisting of signal φ0 of H level and signal φ1 of L level to capacitance control circuit 150.

In this way, in test mode entry circuit 140, the output signal of NAND gate 1411 is introduced to inverter 1416 through P-channel MOS transistor 1413 and N-channel MOS transistor 1414 and test mode entry signal TSIG of H level is generated in a period in which signal STROB is at H level.

Figure 7:
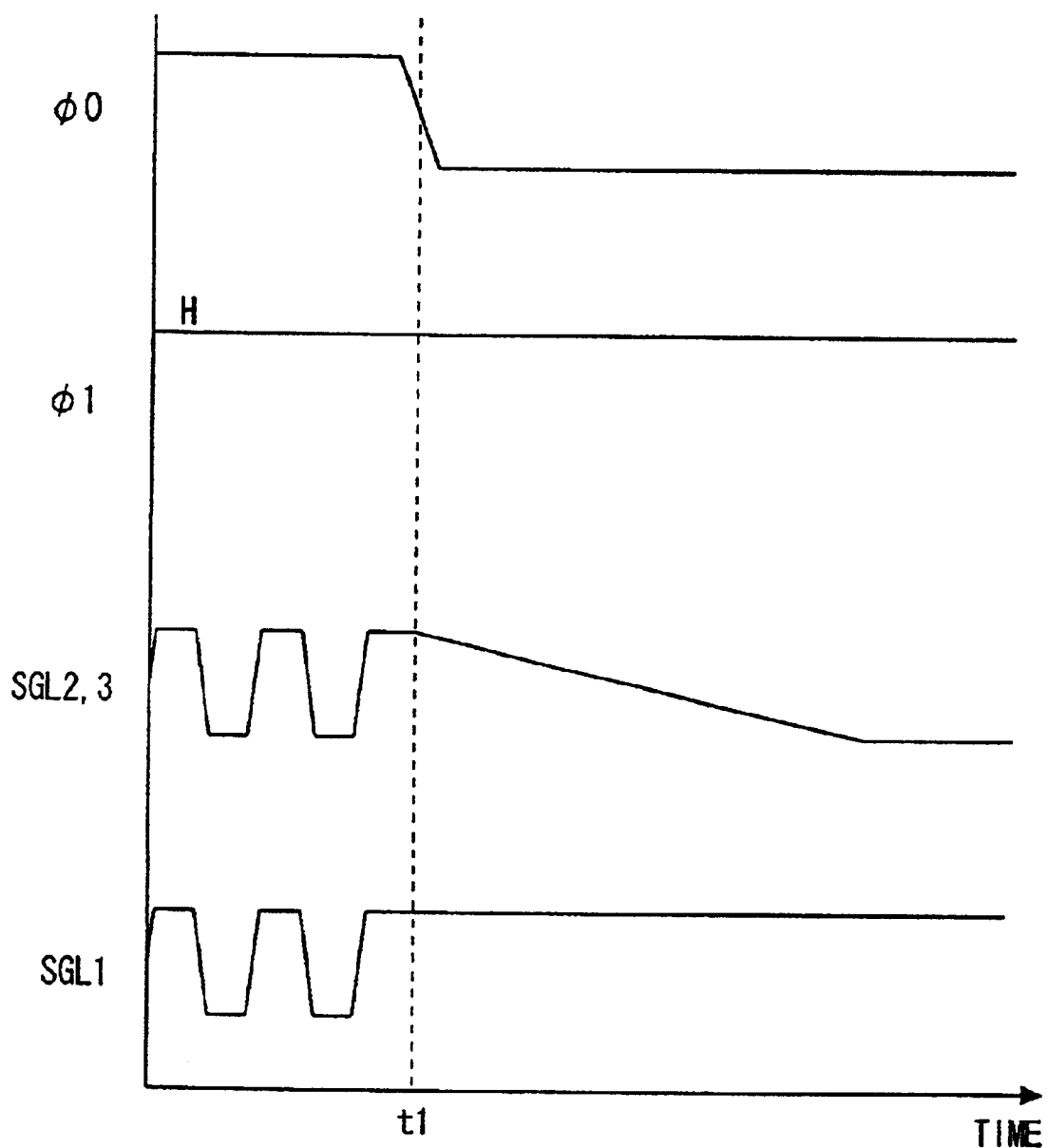
FIG. 7 is a timing chart for a signal for describing a method for reducing noise from adjacent wirings to a signal line.
Figure 8:
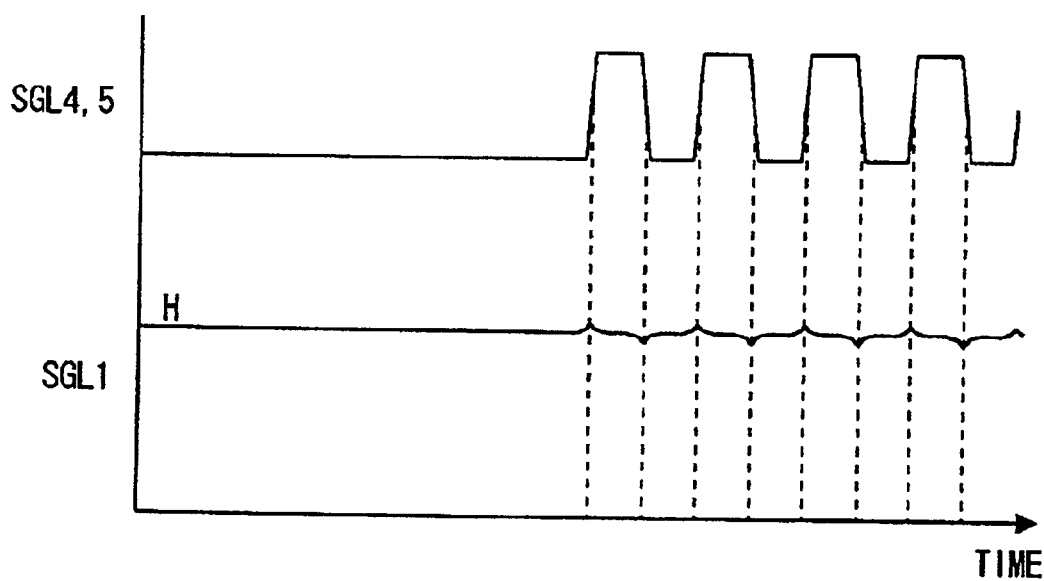
FIG. 8 is a timing chart for a signal transmitted by an adjacent wiring existing in a perpendicular direction to the signal line.

Referring to FIGS. 7 and 8, description will be given to operation for reducing noise from adjacent wirings 4 and 5 to signal line 1 after reducing noise from adjacent wirings 2 and 3 and allowing signal line 1 to transmit a signal at high speed. If clock CLK is transmitted from clock buffer 10, control circuit 20 of DRAM 100 outputs select signals consisting of signals φ0 and φ1 of H level to switch circuit 151 of capacitance control circuit 150. Also, signal lines 1 (thick lines in FIG. 1) to which clock CLK is transmitted are actually connected to capacitance control circuit 150. When receiving signals φ0 and φ1 of H level, switch circuit 151 connects switch S1 to terminal 154 and outputs signal SGL1 (clock CLK) from signal line 1 to driving means 157 and 159 as signals SGL2 and SGL3, respectively, as already described above. Driving means 158 supplies signal SGL1 (clock CLK) to signal line 1, and driving means 157 and 159 supply signals SGL2 and SGL3 to adjacent wirings 2 and 3, respectively. In this case, signals SGL2 and SGL3 equal in phase and amplitude to signal SGL1 supplied to signal line 1 are supplied to adjacent wirings 2 and 3 formed in the same plane as that of signal line 1. By doing so, noise from adjacent wirings 2 and 3 to signal line 1 is effectively eliminated.

Further, at timing t1, if the logical level of signal SGL1 is fixed to H level, control circuit 20 outputs select signals consisting of signal φ0 of L level and signal φ1 of H level to switch circuit 151 of capacitance control circuit 150. Then, as stated above, switch circuit 151 connects switch S1 to terminal 155 and outputs the signal of H level on signal line 1 to driving means 157 and 159 through resistance 153. Then, driving means 157 and 159 transmit the signal of H level supplied through resistance 153 to adjacent wirings 2 and 3, respectively. If so, charges on adjacent wirings 2 and 3 are gradually decreased and the logical levels of signals SGL2 and SGL3 finally become L level. If the logical levels of signals SGL2 and SGL3 become L level, line capacitances C1 and C2 are formed between signal line 1 and adjacent wiring 2 and signal line 1 and adjacent wiring 3, respectively.

While line capacitances C1 and C2 are formed between signal line 1 and adjacent wiring 2 and signal line 1 and adjacent wiring 3, respectively, signals SGL4 and SGL5 are transmitted to adjacent wirings 4 and 5 existing in a perpendicular direction to signal line 1, respectively. If so, signal SGL1 on signal line 1 hardly receives noise from adjacent wirings 4 and 5 and only little noise is superimposed on signal SGL1 at timing at which signals SGL4 and SGL5 are switched from L level to H level or from H level to L level. Accordingly, by forming line capacitances C1 and C2 between signal line 1 and adjacent wirings 2 and 3 formed in the same plane as that of signal line, respectively, it is possible to reduce noise to signal line 1 from adjacent wirings existing in the perpendicular direction to signal line 1 even if signals are transmitted to adjacent wirings 4 and 5 existing in the perpendicular direction to signal line 1.

As can be seen, by allowing the adjacent wirings existing in the perpendicular direction to the signal line to transmit signals while effectively eliminating noise to the signal line from the adjacent wirings formed in the same plane, it is possible to reduce noise to the signal line from the adjacent wirings existing in the perpendicular direction to the signal line. If so, when a signal is transmitted again by the signal line at high speed again, the transmission of the signal to the signal line can start from a state in which noise from the adjacent wirings existing in the perpendicular direction is reduced, noise from the adjacent wirings can be reduced and the signal can be transmitted to the signal line at high speed.

Figure 9:
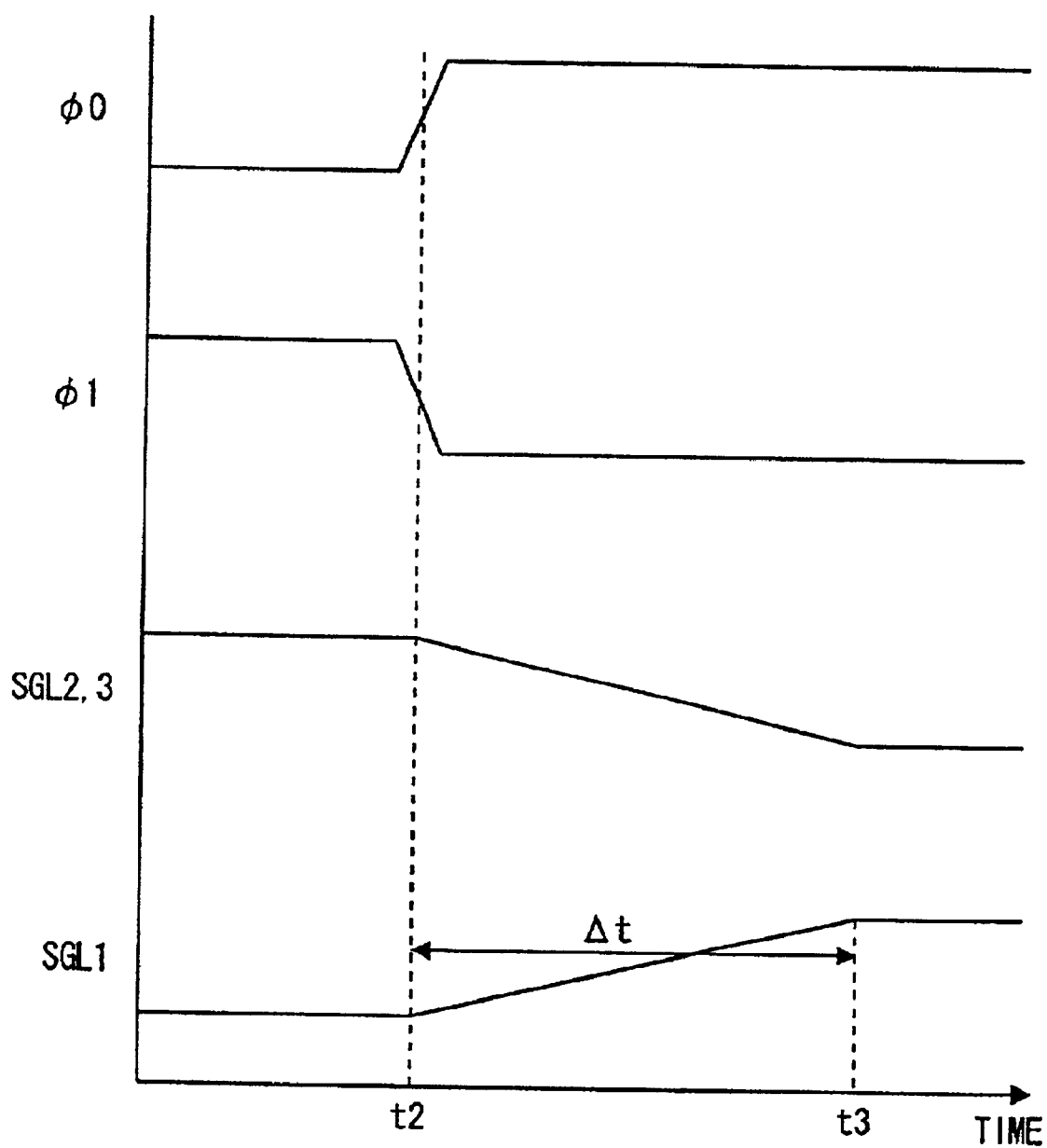
FIG. 9 is a timing chart for a signal for describing a method for measuring the operation margin of the signal line.

Referring to FIG. 9, description will be given to an operation in a case where DRAM 100 enters a test mode. When set signals ST0 to ST2 of H level, reset signals RST0 and RST1 of L level and addresses A0 to A5 of H level are inputted into DRAM 100, test mode entry circuit 150 generates test mode entry signal TSIG of H level and outputs test mode entry signal TSIG of H level thus generated to control circuit 20 as already stated above.

In response to test mode entry signal TSIG of H level, control circuit 20 generates select signals consisting of signal φ0 of H level and signal φ1 of L level and outputs the select signals to switch circuit 151 of capacitance control circuit 151 at timing t2. Then, as already stated above, switch circuit 151 connects switch S1 to terminal 156 and outputs a signal supplied from signal line 1 through inverter 152 to driving means 157 and 159. In this case, signal SGL1 having a logical level switched from L level to H level in a period Δt from timing t2 to timing t3 is transmitted to signal line 1. Accordingly, switch circuit 151 transmits signals SGL2 and SGL3 inverted from signal SGL1 to adjacent wirings 2 and 3 through driving means 157 and 159, respectively.

If so, noise is applied from adjacent wirings 2 and 3 to signal line 1. By checking signal SGL1 transmitted on signal line 1, the operation margin of signal line 1 can be measured.

If DRAM 100 enters the test mode, therefore, the data input and output operation with respect to the memory cells included in memory cell array 110 is tested and the operation margin of the signal line transmitting the signal at high speed is tested, as well.

As stated above, capacitance control circuit 150 supplies the signal on signal line 1 to adjacent wirings 2 and 3 as it is, supplies the signal on the signal line 1 to adjacent wirings 2 and 3 through resistance 153, or inverts the signal on signal line 1 and supplies the inverted signal to adjacent wirings 2 an 3 in accordance with each mode. The supply of the signal on signal line 1 to adjacent wirings 2 and 3 by the three methods corresponds to the controlling of line capacitance generated between signal line 1 and adjacent wiring 2 (or adjacent wiring 3).

Figure 10:
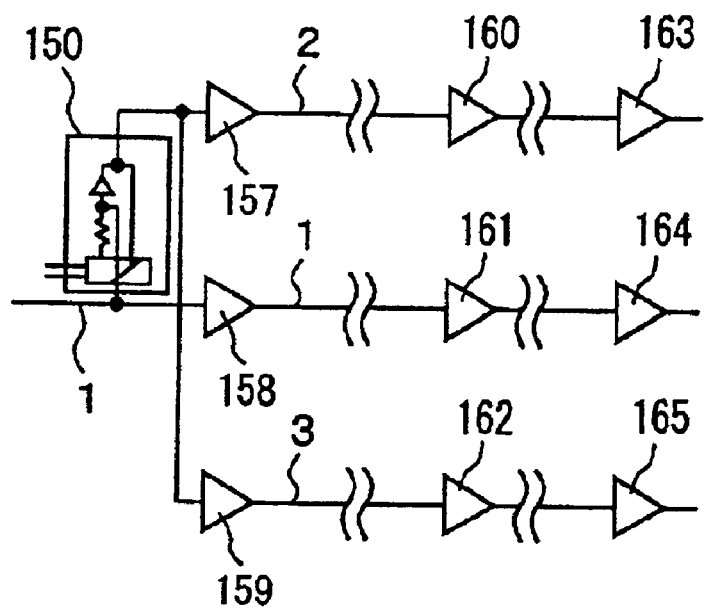
FIG. 10 is another circuit diagram of a capacitance control circuit and periphery thereof.
Figure 11:
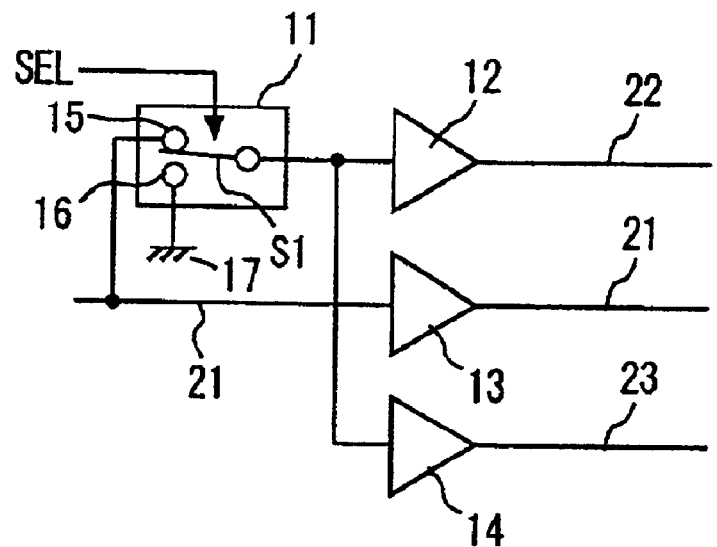
FIG. 11 is an explanatory view for a conventional method for supplying signals to a signal line and adjacent wirings.
Figure 12:
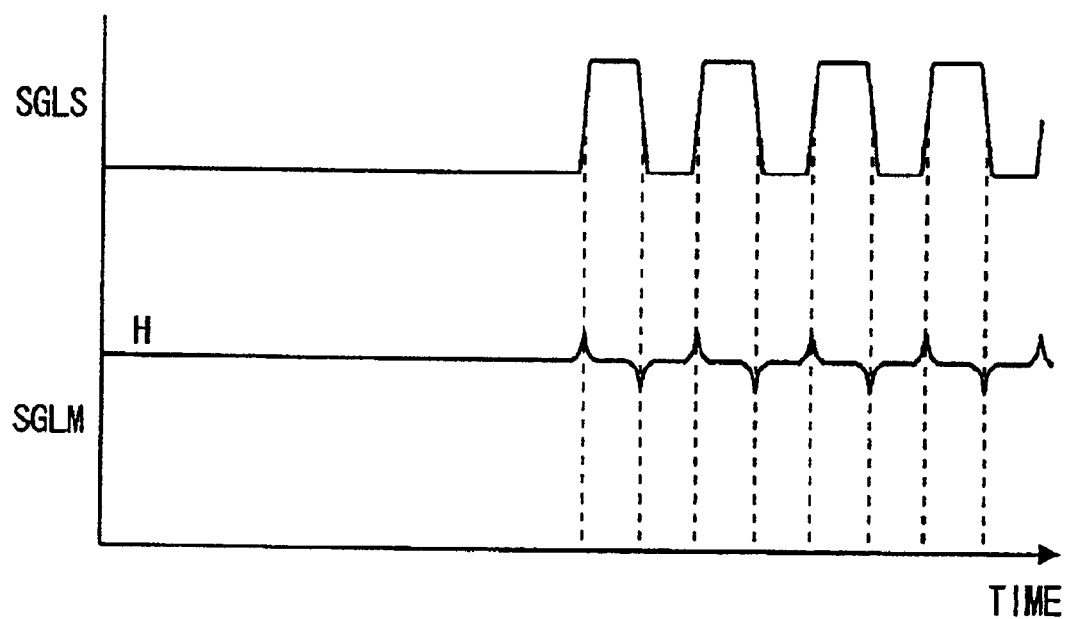
FIG. 12 is a view for describing conventional disadvantages.

As shown in FIG. 10, if signal line 1 and adjacent wirings 2 and 3 are long, repeaters 160 to 165 may be provided in the middle of signal line 1 and adjacent wirings 2 and 3. This makes it possible to transmit the signal on signal line 1 and adjacent wirings 2 and 3 while preventing the attenuation of the signal.

This invention is also applied to a case where one of adjacent wirings 2 and 3 and one of adjacent wirings 4 and 5 shown in FIG. 2 are formed. That is, the number of adjacent wirings formed in the same plane as that of signal line 1 is not limited to two but one adjacent wiring may be formed therein, and the number of adjacent wirings existing in the perpendicular direction to signal line 1 is not limited to two but one adjacent wiring may be formed therein.

Moreover, after the line capacitance is formed between signal line 1 and the adjacent wiring, the adjacent wiring to which the signal is transmitted does not necessarily exist in the perpendicular direction to signal line 1 but the adjacent wiring may be formed in the same plane as that of signal line 1. Accordingly, if the logical level of the signal on signal line 1 is fixed to H level and the signal on signal line 1 is transmitted to adjacent wiring 2 through resistance 153 after transmitting a signal equal in phase and amplitude to the signal on signal line 1 to adjacent wiring 2, charges on adjacent wiring 2 are gradually decreased and line capacitance C1 is formed between signal line 1 and adjacent wiring 2.

Further, if signal SGL4 (or signal SGL5) shown in FIG. 8 is applied to adjacent wiring 3, it is possible to almost prevent noise from adjacent wiring 3 to signal line 1 as already stated above.

Furthermore, although description has been given to the method for reducing noise from the adjacent wirings to the signal line while taking DRAM as an example, this invention should not be limited thereto but can normally be applied to a semiconductor device including a signal line transmitting a signal at high speed and a plurality of adjacent wirings adjacent this signal line.

Additionally, capacitance control circuit 150 can set line capacitances C1 and C2 higher than line capacitances C3 and C4 by controlling the quantity of charges supplied to adjacent wirings 2 and 3. As a result, noise from adjacent wirings 4 and 5 to signal line 1 can be reduced. That is to say, the present invention forms line capacitances C1 and C2 between the signal line and part of adjacent wirings; i.e., wirings 2 and 3, respectively and supplies a signal to other adjacent wirings 4 and 5 if a plurality of adjacent wirings 2 to 5 adjacent the signal line exist. By doing so, noise from other adjacent wirings 4 and 5 to the signal line can be reduced. In this case, capacitance control circuit 150 supplies charges to adjacent wirings 2 and 3 so as to set line capacitances C1 and C2 higher than line capacitances C3 and C4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a signal line transmitting a signal;
   first and second adjacent wirings provided at positions for forming line capacitances together with said signal lines, respectively, in parallel to said signal line; and
   a capacitance control circuit forming a second line capacitance higher than a first capacitance formed between said signal line and said first adjacent wiring; wherein
   said capacitance control circuit includes:
      a first path for directly applying charges constituting a same signal as the signal applied to said signal line, to said second adjacent wiring;
      a second path for applying said charges to said second adjacent wiring through a resistance; and
      a switch selectively connecting one of said first and second paths to said second adjacent wiring, wherein said switch connects said first path to said second adjacent wiring when a signal to be transmitted at high speed is applied to said signal line, and connects said second path to said second adjacent wiring when a potential on said signal line is constant.

2. A semiconductor device comprising:
   a signal line transmitting a signal;
   first and second adjacent wirings provided at positions for forming line capacitances together with said signal lines, respectively, in parallel to said signal line;
   a capacitance control circuit forming a second line capacitance higher than a first capacitance formed between said signal line and said first adjacent wiring; and
   a test mode entry circuit generating a test mode entry signal; wherein
   said capacitance control circuit applies charges constituting an inverted signal inverted from a signal applied to said signal line, to said second adjacent wiring in response to said test mode entry signal.

3. A semiconductor device comprising:
   a signal line transmitting a signal;
   first and second adjacent wirings provided at positions for forming line capacitances together with said signal lines, respectively, in parallel to said signal line;
   a capacitance control circuit forming a second line capacitance higher than a first capacitance formed between said signal line and said first adjacent wiring; and
   a test mode entry circuit generating a test mode entry signal; wherein
   said capacitance control circuit includes:
      a first path for directly applying charges constituting a same signal as a signal applied to said signal line, to said second adjacent wiring;
      a second path for applying said charges to said second adjacent wiring through a resistance;
      a third path for applying charges constituting an inverted signal inverted from the signal applied to said signal line, to said second adjacent wiring; and
      a switch selectively connecting one of said first, second and third paths to said second adjacent wiring, wherein
      said switch connects said first path to said second adjacent wiring when a signal transmitted at high speed is applied to said signal line;
      said switch connects said second path to said second adjacent wiring when a potential on said signal line is constant; and
      said switch connects said third path to said second adjacent wiring when said test mode entry signal is inputted.

4. A semiconductor device comprising:

a signal line transmitting a signal;

first and second adjacent wirings provided at positions for forming line capacitances together with said signal lines, respectively, in parallel to said signal line; and a capacitance control circuit forming a second line capacitance higher than a first capacitance formed between said signal line and said first adjacent wiring; wherein said signal line and said second adjacent wiring are formed on a same substrate layer; and said first adjacent wiring is formed on a layer arranged in a perpendicular direction to said substrate layer.

5. A semiconductor device comprising:

a signal line transmitting a signal;

first and second adjacent wirings provided at positions for forming line capacitances together with said signal lines, respectively, in parallel to said signal line;

a capacitance control circuit forming a second line capacitance higher than a first capacitance formed between said signal line and said first adjacent wiring; and a third adjacent wiring provided at a position for forming a line capacitance together with said signal line, in parallel to said signal line; wherein said capacitance control circuit further forms a third line capacitance higher than said first line capacitance between said signal line and said third adjacent wiring.

6. The semiconductor device according to claim 5, further comprising:

a fourth adjacent wiring provided at a position for forming a ling capacitance together with said signal line, in parallel to said signal line, and wherein said capacitance control circuit forms said second and third line capacitances higher than a fourth line capacitance formed between said signal line and said fourth adjacent wiring and said first line capacitance, between said signal line and said second adjacent wiring and between said signal line and said third adjacent wiring, respectively.

7. The semiconductor device according to claim 6, wherein said signal line, said second adjacent wiring and said third adjacent wiring are formed on a same substrate layer; and said first and fourth adjacent wirings are formed on different layers arranged in a perpendicular direction to said substrate layer, respectively.

* * * * *